MONOLITHIC BISTABLE FLIP-FLOP

Filed March 8, 1962

INVENTOR.
JOHN PHILIPS.

BY
C. L. Menzemer
ATTORNEY 3,248,616
Patented Apr. 26, 1966

3,248,616

MONOLITHIC BISTABLE FLIP-FLOP

John Philips, Pittsburgh, Pa., assignor to Westinghouse Electric Corporation, East Pittsburgh, Pa., a corporation of Pennsylvania Filed Mar. 8, 1962, Ser. No. 178,476
1 Claim. (Cl. 317—235)

This invention relates to a semiconductor device and more particularly it relates to a monolithic semiconductor device that functions as a bistable flip-flop.

In many computing, data processing and switching operations, bistable multivibrators or flip-flops are needed in great numbers. Such devices have been provided heretofore by appropriate interconnected vacuum tubes and associated circuitry, and more recently by using transistors in the prior circuits with suitable modification. Such devices were improved with the substitution of transistors for vacuum tubes, because transistors are smaller and more rugged than vacuum tubes, require no filament power, operate at a low supply voltage, dissipate relatively little power, and ordinarily have a service life that exceeds that of heated filament vacuum tubes.

Bistable multivibrators or flip-flops are used in great numbers, and accordingly the advantages attending transistor substitution for vacuum tubes are multiplied. However, even transistor-containing devices are complex and bulky in the aggregate, and subject to material failure in consequence of the many parts and connections that are involved.

It is therefore the primary object of the present invention to provide a bistable multivibrator or flip-flop comprising cooperating portions made up of p-n junctions, resistance regions and a functionally negative resistance region all within a unitary or monolithic body of semiconductor material.

Other objects of the invention will be apparent from the following detailed description.

The invention will be readily understood upon considering its detailed description in conjunction with the drawings, in which.

A component type flip-flop can be constructed from a controllable negative resistance device and a suitable series resistor. Such a device has two stable operating points. When a D.-C. voltage is applied through the components to ground, the output characteristic evidences a first stable state. Application of a current pulse to the input of the unit causes a switching to a second stable state. When an opposite polarity pulse is later applied, the unit switches back to essentially the first stable state, in effect "remembering" the polarity of the last input signal. In accordance with the teachings of the present invention, this entire function can be provided in a unitary monolithic body of semiconductor material, eliminating all connections and leads except input, output and power leads.

For the purpose of clarity, the present invention will be described specifically in terms of preparing a bistable or multivibrator or flip-flop in a semiconductor silicon body. It will be understood, however, that in addition to silicon other semiconductor materials may be used, for example germanium, silicon carbide or a semiconducting compound comprised, for example, of stoichiometric proportions of elements from Group III of the Periodic Table, for example gallium and indium, and elements from Group V, for example arsenic, phosphorus and antimony. Examples of suitable III–V stoichiometric compounds include gallium arsenide, indium antimonide and the like compounds. It will also be understood that the silicon or other semiconductor may be processed so that the semiconductivity of the various regions may be reversed in preparing devices of the invention from that hereinafter specifically indicated for purposes of illustration.

Figure 1:
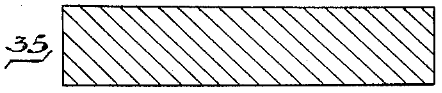
FIGS. 1 and 2 are side views in cross section of a wafer of a semiconductor material being processed in accordance with the teachings of this invention.

Referring now to FIG. 1, there is illustrated a single crystal silicon wafer 35 of n-type semiconductivity. The wafer 35 may be prepared by any of the many methods available in the art. By way of example, a single-crystal silicon rod may be pulled from a melt comprised of silicon and at least one element from Group V of the Periodic Table, for example, arsenic, antimony or phosphorus. A wafer can be cut from the rod with, for example, a diamond saw; its surfaces may be smoothed by lapping, etching, or the like, if desired. A section of a dendritic crystal prepared in accordance with United State patent application Serial Number 844,288, filed October 5, 1959, now Patent No. 3,031,403, may also be used as the semiconductor material. The silicon wafer 35 may have a resistivity of about 10 ohm-cm. to 100 ohm-cm., and suitably about 50 ohm-cm., though, as is evident to the artisan, it can vary therefrom by a factor of 10 or more for certain conditions of operation.

The wafer 35 is disposed in a diffusion furnace. The hottest zone of the furnace is at a temperature within the range of about 1100° C. to 1250° C. and contains an atmosphere of the vapor of an acceptor doping material, for example, indium, gallium, aluminum or boron. The zone of the furnace within which a crucible of the acceptor impurity is located may be at a temperature of from 600° C. to 1250° C., the specific temperature being chosen to ensure the desired vapor pressure and surface concentration of diffusant from the crucible. The acceptor impurity diffuses into the surface of the n-type wafer. Since the acceptor impurity will normally diffuse through all sides of the wafer it may be necessary to mask the surfaces through which no diffusion should occur. Alternatively where diffusion has occurred through all surfaces, the diffused layers can be removed by abrasion, etching or the like, where such diffusion is undesired. On the other hand, the undesired layers can be permitted to remain because the desired areas or zones can be isolated therefrom in a manner that will become apparent hereinafter.

Figure 2:
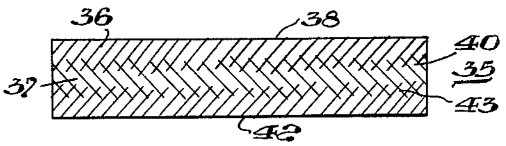

After diffusion through all surfaces, wafer 35 has a p-type region 36 around its entire surface leaving a diminished n-region 37, as shown in FIG. 2. The bottom surface of the p-type region extending from the top surface 38 of the wafer forms a first p–n junction 40 in the wafer with the top of the intermediate region 37, and the p-type region extending from the bottom surface 42 forms with the n-region 37 a second p–n junction 43.

The depth or thickness of the p-type region 36 produced in the semiconductor wafer 35 is dependent primarily upon the desired design characteristics of the resulting device. In addition, it must be deep enough to permit the alloying or fusion of contacts therewith without penetration through p-type region 36 to the n-type region 37. A depth of about 1.5 mils inwardly from each surface has been found to be satisfactory in a wafer having a total thickness of about 3 to 10 mils where alloy contacts are to be used as is about to be discussed. These layers can actually be considerably thinner where, for example, the contacts are provided by evaporation techniques.

Figure 3:
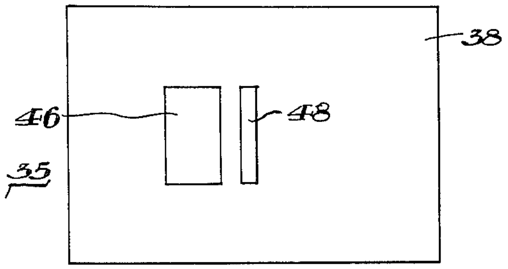
FIG. 3 is a top view of a wafer of semiconductor material showing the location of foil contacts.

Referring now to FIG. 3, an emitter portion 46 of n-type semiconductivity and an ohmic contact 48 of p-type conductivity are formed on the top surface 38 of the wafer 35 by disposing the respective material, suitably in the form of shaped foils, upon the top surface 38 of wafer 35 and alloying or fusing the foils thereto by heating in a vacuum of at least $10^{-2}$ mm. Hg, and preferably $10^{-5}$ mm. Hg, at a temperature of about 600° to 700° C. The emitter portion 46 may be formed, for example, from a foil comprised of at least one suitable n-type material, for example antimony, arsenic, or phosphorus and a neutral metal, such as gold. Typical emitter alloys include an alloy comprised of 99.0 to 99.5 percent gold and 0.5 to 1 percent antimony. The ohmic contact 48, as well as the other ohmic contacts to be mentioned hereinafter, may be formed from, for example, a shaped foil comprised of at least one suitable p-type material, for example, boron; aluminum gallium or indium and a neutral metal, for example gold. Examples of suitable alloys include an alloy of 0.1 percent of boron and the remainder gold. A suitable thickness of the foils used to form emitter 46, ohmic contact 48 and the other ohmic contacts to be described can be determined from a component phase diagram and the thickness of the p-zone 36. For present purposes, foils of about 0.75 to 1.25 mils and preferably 1 mil are satisfactory.

Figure 5:
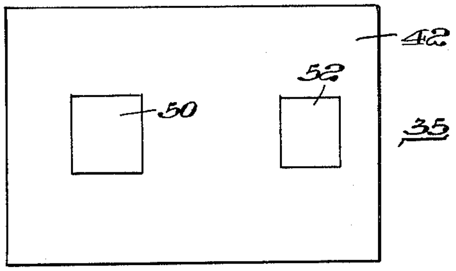
FIG. 5 is a bottom view of the wafer being further processed to apply ohmic contacts.

Referring to FIG. 5, spaced ohmic contacts 50 and 52 are provided on the bottom surface 42. These contacts can be composed of the same, or similar, material to that used for ohmic contact 48 mentioned above. Preferably, these contacts are fused or alloyed with the wafer 35 in the same operation by which alloying or fusion of the emitter 46 and ohmic contact 48 occur.

After the emitter and ohmic contacts are provided, the top and bottom surfaces 38 and 42 respectively of wafer 35 are coated with an acid resisting masking material 54, for example, Apiezon wax. (Refer to FIGS. 4 and 6 for views of the top 38 and bottom 42 of wafer 35.) A line 56, comprised of segments 58, 59, 60 and 61, is scribed entirely through the wax about the emitter 46 and ohmic contact 48. The coated surface 38 is then etched with a suitable silicon etchant, for example, an etchant comprised of, by volume, 3 parts of nitric acid, 1 parth hydrofluoric acid and 1 part acetic acid. The etching is continued until the scribed lines are etched entirely through the p-type region 36 into the n-type region 37 (see FIG. 2) whereby a groove completely around the emitter 46 and ohmic contact 48 is provided. A line 64, composed of segments 65, 66, 67 and 68, is scribed entirely through the wax on the bottom surface 42. This too is etched, as just described, entirely through to the n-zone 37 thereby providing a groove entirely around ohmis contacts 50 and 52. The etching is then terminated and the masking material 54 is removed from both the top 38 and bottom 42 surfaces of wafer 35. Of course, means other than etching may be employed to provide the grooves. For example, the now conventional photoresist and etching techniques can be used. It is to be noted that the grooves provided effectively determine the areas circumscribed and comprise an easy way to adjust the internal electrical characteristics therein.

Figures 4, 6, 7:
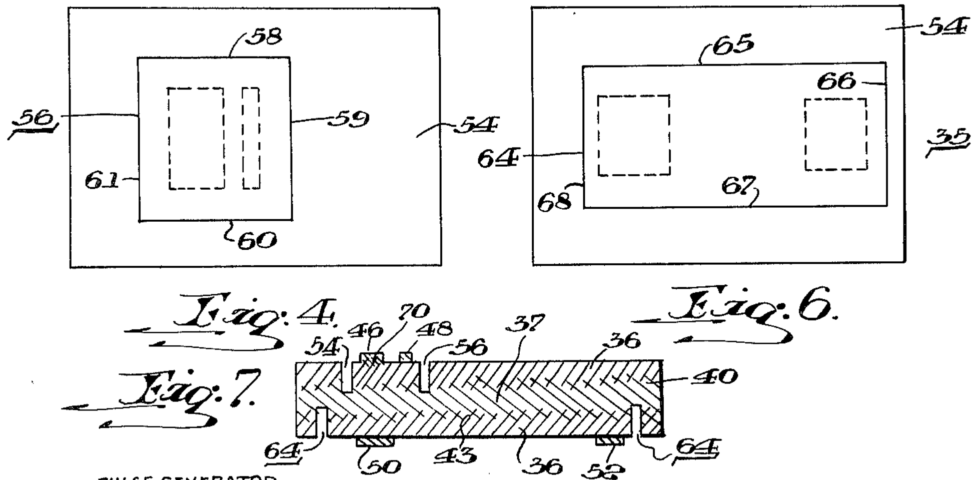
FIG. 4 is another top view of the wafer of semiconductor material showing the location of a groove thereon.
FIG. 6 is a bottom view of the wafer of semiconductor material being further processed.
FIG. 7 is a side view in cross-section of a monolithic bistable flip-flop of the invention.

FIG. 7 shows, in side section, wafer 35 after the foregoing operations are completed. It should be noted that the n-type emitter 46, upon fusion with the surface 36 of the wafer, provides an additional n–p junction 70 in the device. It will also be noted that the grooves 56 and 64 cut entirely through the p–n junctions 40 and 43 respectively. This processed wafer is, as thus described, a molecularized or monolithic bistable multivibrator or flip-flop built within a unitary body of semiconductor material.

The bistable multivibrator or flip-flop is comprised functionally of a negative resistance, the npnp structure, and a balancing resistance comprised essentially of the p zone between ohmic contacts 50 and 52 (see FIG. 7). The etched lines 56 and 64 effectively limit the paths of carriers between the various regions and further serve to define, as to the resistance area between ohmic contacts 50 and 52.

Figure 8:
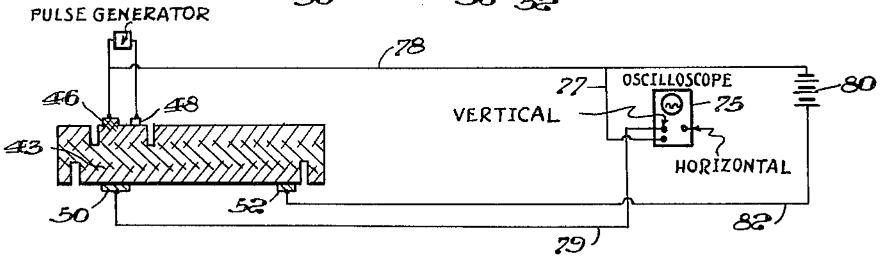
FIG. 8 is a view of the monolithic bistable flip-flop of FIG. 7 in circuit with a power source and a load.

With reference to FIG. 8, the device can be connected to a load, such as an oscilloscope 75, by leads 77 and 78 to the emitter region 46 and by lead 79 to ohmic contact 50, respectively. The power source 80 is connected to the device with a lead 82 from the positive terminal to ohmic contact 52 and the negative terminal by a lead 83 to the emitter 46. A pulse generator 85 is connected across the emitter 46 and the base contact 48. With power applied, the device evidences its first stable state. Upon application of a pulse, it switches to its second characteristic state and remains there until it receives another pulse of a suitable polarity to bring it to its first steady operating state again.

The invention will be described further in conjunction with the following specific example in which the details are given for purposes of illustration and not by way of limitation.

*Example*

An n-type silicon wafer 100 x 400 x 6 mils having a resistivity of about 50 ohm cm. is diffused with aluminum on all sides to a depth of 1.5 mils, creating a three-zone pnp structure. This is accomplished by heating the wafer in an evacuated quartz capsule for about two hours in a furnace at about 1200° C. in an atmosphere of aluminum generated by heating a container of aluminum therein at a temperature of about 1200° C. Four 20 x 40 x 1 mil foil contacts are alloyed to the p-type diffused top and bottom layers by heating those foil contacts in place on the wafer to 700° C. in a vacuum of $10^{-5}$ mm. Hg. One of these contacts (a foil comprised of 99.5 percent gold and 0.5 percent antimony) forms an emitter region in the resulting device, while the other three (comprised of 99 percent gold and 1 percent boron) make ohmic contacts to the diffused aluminum layer. The top and bottom surfaces of the wafer are then masked with a thin layer of Apiezon wax and are scribed with lines as shown in FIGS. 3 and 5 with a sharp-pointed tool. A groove is etched into the wafer with an etchant comprised, by volume, of 3 parts nitric acid, 1 part hydrofluoric acid and 1 part acetic acid. The etching is continued until the scribed lines are etched through the p aluminum layer to the n-silicon material so that shorting possibilities are avoided. After termination of the etching, the wax is removed from the surfaces.

The device is electrically tested to determine the value of the resistance needed between the contacts on the bottom surface. At each voltage, the npnp structure has a characteristic holding current. Excess current will short it and a current below the holding current will render it non-conducting. Accordingly, for a given voltage operation, the resistance that is provided between the contacts must be sufficient to provide a current flow that just exceeds the characteristic holding current at that voltage. If the resistance in the body is too small initially, as determined in accordance with the characteristics just stated, this region is further etched until the desired value of the resistance is obtained. Etching increases the bulk resistance of this region simply by making it narrower and thinner. This resistance may, of course, have a fairly wide range of values depending on the voltage at which operation is to be had and the holding current of the npnp structure; a typical value is 10K ohms.

Specific devices as just described have been fabricated and tested. With a 4½ volt potential between ohmic contact 52 and the emitter 46, a positive pulse applied on contact 48 of about 15 volts at one microsecond turns the switch on and a negative pulse at emitter 46 of 15 volts at one microsecond turns the device off, for the npnp structure, and at these conditions of operation an output of 3½ volts is evidenced. As noted hereinbefore, the output waveform is essentially a square pulse pattern at these frequencies. Frequencies up to 50 kc. have been obtained and higher ones can be readily achieved.

From the foregoing discussion and description, it is apparent that this invention provides a unique functional electronic block. This device can perform the same function of an individual component system that is 100 times larger in weight and size. However, in view of the monolithic construction, the device of this application is inherently more reliable than the corresponding component system.

It should be apparent that changes can be made without departing from the scope of the invention, which broadly comprises a functionally negative resistance element in series with a balancing resistance all within a unitary body of a semiconductor or material. The balancing resistance is in all instances sufficiently large to result in a current beyond the holding current of the overall structure to ensure that the second stable state exists. That resistance is shown in the bottom layer of the device. It could as readily be provided in the top layer, thereby limiting the number of contacts on the bottom surface to one. In that instance, connection of external leads is easier and the encasing material that may be used can contact the single ohmic contact on the bottom surface. By providing the various conductivity zones in the semiconductor wafer by planar techniques in which diffusion and evaporation practices are used, the geometry shown can be changed and the fabrication of the device can be simplified. For example, the scribe lines need not be applied with planar fabrication techniques. Other changes that can be made will be apparent to those skilled in the art.

In accordance with the provisions of the patent statutes, the invention has been described and explained with what is now believed to represent its best embodiment. However, it should be understood that the invention can be practiced otherwise than as specifically illustrated and described.

I claim as my invention:

A monolithic bistable multivibrator semiconductor device comprising a unitary body of a semiconductor material, said body containing a top and a bottom region of a first type of semiconductivity and an intermediate region of a second type of semiconductivity, a first p-n junction between the bottom surface of the top region and the top surface of the intermediate region, a second p-n junction between the top surface of the bottom region and the bottom surface of the intermediate region, first and second ohmic contacts disposed on the bottom surface of the bottom region, a third ohmic contact on the top surface of the top region, a region of said second type of semiconductivity formed on the top surface of said top region adjacent the ohmic contact thereon, a third p-n junction between the top surface of said top region and the bottom surface of said region of second type of conductivity on the top surface of said top region, the ohmic contact and the region of second type of semiconductivity on the top surface of the top region of the body of semiconductor material being substantially opposite one of the ohmic contacts on the bottom surface of the bottom region, a groove in the top surface of the top region about said region of second type of conductivity and ohmic contact thereon, a second groove in the bottom surface of the bottom region extending around the two ohmic contacts thereon, each of the grooves extending entirely through their respective regions to the intermediate region of the body of semiconductor material.

References Cited by the Examiner

UNITED STATES PATENTS

| | | | |
|---|---|---|---|
| 2,855,524 | 10/1958 | Shockley | 317—235 |
| 2,992,337 | 7/1961 | Rutz | 317—235 |
| 2,993,154 | 7/1961 | Goldey | 317—235 |

DAVID J. GALVIN, *Primary Examiner*.